United States Patent
Schwan et al.

(10) Patent No.: US 7,563,731 B2
(45) Date of Patent: Jul. 21, 2009

(54) FIELD EFFECT TRANSISTOR HAVING A STRESSED DIELECTRIC LAYER BASED ON AN ENHANCED DEVICE TOPOGRAPHY

(75) Inventors: Christoph Schwan, Gebhardshain (DE); Manfred Horstmann, Duerrrhoehrsdorf-Dittersbach (DE); Kai Frohberg, Niederau (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 155 days.

(21) Appl. No.: 11/739,279

(22) Filed: Apr. 24, 2007

(65) Prior Publication Data

US 2008/0081486 A1 Apr. 3, 2008

(30) Foreign Application Priority Data

Sep. 29, 2006 (DE) .................. 10 2006 046 375

(51) Int. Cl.
*H01L 21/31* (2006.01)
*H01L 21/469* (2006.01)
(52) U.S. Cl. ............... 438/792; 438/902; 257/E21.478; 257/E21.64; 257/638; 257/E29.132
(58) Field of Classification Search .................. 438/792, 438/763, 902; 257/E21.478, E21.487, E21.49, 257/E21.64, 249, 638, E29.128, E29.132
See application file for complete search history.

(56) References Cited

U.S. PATENT DOCUMENTS

| 6,229,174 | B1 * | 5/2001 | Parekh ........................ 257/306 |
| 2005/0167652 | A1 * | 8/2005 | Hoffmann et al. ............. 257/18 |
| 2006/0205214 | A1 * | 9/2006 | Shih et al. .................... 438/682 |
| 2008/0233738 | A1 * | 9/2008 | Beyer et al. .................. 438/643 |

FOREIGN PATENT DOCUMENTS

WO 2005010982 2/2005

OTHER PUBLICATIONS

German Official Communication Dated Sep. 3, 2007 for serial No. 10 2006 046 375.7-33.

* cited by examiner

*Primary Examiner*—Caridad M Everhart
(74) *Attorney, Agent, or Firm*—Williams, Morgan & Amerson, P.C.

(57) ABSTRACT

By increasing the transistor topography after forming a first layer of highly stressed dielectric material, additional stressed material may be added, thereby efficiently increasing the entire layer thickness of the stressed dielectric material. The corresponding increase of device topography may be accomplished on the basis of respective placeholder structures or dummy gates, wherein well-established gate patterning processes may be used or wherein nano-imprint techniques may be employed. Hence, in some illustrative embodiments, a significant increase of strain may be obtained on the basis of well-established process techniques.

21 Claims, 8 Drawing Sheets

FIELD EFFECT TRANSISTOR HAVING A STRESSED DIELECTRIC LAYER BASED ON AN ENHANCED DEVICE TOPOGRAPHY

BACKGROUND OF THE INVENTION

1. Field of the Invention

Generally, the present disclosure relates to the formation of integrated circuits, and, more particularly, to the formation of field effect transistors in complex circuits, wherein transistor performance is increased by producing strain in the channel region on the basis of a dielectric layer comprising a high intrinsic stress.

2. Description of the Related Art

Integrated circuits are manufactured by forming a large number of circuit elements on a given chip area on the basis of complex microelectronic techniques including, for example, lithography, etching, deposition and implantation techniques. Generally, a plurality of process technologies are currently practiced, wherein, for complex circuitry, such as microprocessors, storage chips and the like, CMOS technology is currently one of the most promising approaches, due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions also raises a plurality of issues associated therewith that have to be addressed so as to not unduly offset the advantages obtained by steadily decreasing the channel length of MOS transistors. One major problem in this respect is the reduction of so-called short channel effects, which occur upon reducing the channel length. Generally, with a reduced channel length, the controllability of the channel becomes increasingly difficult and requires specific design measures, such as reduction of the thickness of the gate insulation layer, increased doping concentrations in the channel regions and the like. Some of these countermeasures may, however, reduce the charge carrier mobility in the channel region, thereby reducing transistor performance. Accordingly, to compensate or even overcompensate for these effects, it has been proposed to increase the charge carrier mobility in the channel region for a given channel length.

In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device and may affect the channel controllability as previously explained, thereby making a reduction of the dopant concentration a less attractive approach unless other mechanisms are developed so as to adjust a desired threshold voltage. Second, the lattice structure in the channel region may be modified, for instance by creating tensile or compressive strain therein, which results in a modified mobility for electrons and holes, respectively. For example, creating tensile strain in the channel region along a standard crystallographic orientation may increase the mobility of electrons, which, in turn, may directly translate into a corresponding increase in the conductivity for N-type transistors. On the other hand, compressive strain in the channel region along the channel length direction may increase the mobility of holes, thereby providing the potential for enhancing the performance of P-type transistors.

Therefore, a technique is frequently used that enables the creation of desired stress conditions within the channel region of different transistor elements by individually modifying the stress characteristics of a contact etch stop layer that is formed after completion of the basic transistor structure in order to form contact openings in an interlayer dielectric material for connecting to the gate and drain and source terminals. The effective control of mechanical strain in the channel region, i.e., effective stress or strain engineering, may be accomplished by individually adjusting the internal stress in the contact etch stop layers in order to position a contact etch contact layer having an internal compressive stress above a P-channel transistor while positioning a contact etch stop layer having an internal tensile stress above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used, due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 2 GPa of tensile stress, wherein the type and the magnitude of the intrinsic stress may be efficiently adjusted by selecting appropriate deposition parameters. For example, ion bombardment, deposition pressure, substrate temperature, gas components and the like represent respective parameters that may be used for obtaining the desired intrinsic stress. Since the contact etch stop layer is positioned close to the transistor, the intrinsic stress may be efficiently transferred into the channel region, thereby significantly improving the performance thereof. Moreover, for advanced applications, the strain-inducing contact etch stop layer may be efficiently combined with other strain-inducing mechanisms, such as strained or relaxed semiconductor materials that are incorporated at appropriate transistor areas in order to also create a desired strain in the channel region. Consequently, the stressed contact etch stop layer is a well-established design feature for advanced semiconductor devices, wherein, however, the interaction of the contact etch stop layer with the overlying interlayer dielectric material, i.e., silicon dioxide formed from TEOS on the basis of PECVD due to the advantageous characteristics with respect to material integrity in the further manufacturing process, may result in a reduced performance gain. Thus, it has been proposed to increase the thickness of the stressed contact etch stop layer in order to enhance the strain in the channel regions. However, the device topography of advanced field effect transistors may impose severe restrictions for depositing the stressed silicon nitride material. For example, the gate height may represent one limitation for continuously increasing the strain, since the significant amounts of stressed material above the gate electrode may negatively influence the strain transfer mechanism. Simply increasing the gate height may, however, be a less desirable solution to this problem, since the patterning process for advanced transistors is highly complex and may therefore lead to additional process issues. Moreover, the corresponding fringing capacitance of the gate electrodes may also increase with an increasing gate height, thereby reducing the device performance. Furthermore, for a given distance between closely spaced gate electrodes, the fill capability of the deposition process may result in corresponding voids in the stressed silicon nitride material, thereby resulting in respective process nonuniformities during the subsequent contact etch process, when contact openings have to formed in the dielectric material enclosing the transistors.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for enhancing the strain created in a channel region of a transistor by increasing the efficiency of the stress transfer mechanism obtained by a dielectric material enclosing the transistor element. For this purpose, the transistor topography may be appropriately adjusted during the manufacturing sequence for forming a highly stressed dielectric material in order to enable the deposition of an increased amount of the dielectric material while not imposing undue constraints on the gap-filling capabilities of the deposition technique. For this purpose, a dummy structure or a non-active placeholder structure aligned to the respective gate electrode may be provided intermittently with a corresponding deposition step for providing the highly stressed dielectric material. In this way, similar deposition conditions may be re-established after the deposition of a first layer of the highly stressed dielectric material, thereby providing the possibility of significantly enhancing the respective layer thickness of the stressed dielectric material, which may therefore induce an increased amount of strain in the respective channel region. Consequently, well-established process techniques may be employed for creating a high degree of strain in the channel region without requiring complex manufacturing processes in lower lying device levels, such as the provision of strained semiconductor materials and the like. On the other hand, the efficient adaptation of the device topography may also be combined with other strain-inducing mechanisms, wherein, in particular, an appropriate local adaptation of the finally obtained amount of strain may be controlled, since the corresponding process steps for modifying the topography and forming a stressed dielectric material may be locally tuned to obtain a specific type of strain, even at transistor level.

According to one illustrative embodiment disclosed herein, a method comprises forming a first dielectric layer above a transistor having a gate electrode, wherein the first dielectric layer has a predefined type of intrinsic stress. Furthermore, a first placeholder structure is formed above the gate electrode to locally increase a device height above the gate electrode. Moreover, a second dielectric layer is formed above the transistor and the first placeholder structure, wherein the second dielectric layer has the predefined type of intrinsic stress.

According to another illustrative embodiment disclosed herein, a method comprises forming a first dielectric material adjacent to a channel region of a transistor, wherein the first dielectric material exhibits a predefined type of intrinsic stress. Next, the device topography is locally increased above a gate electrode of the transistor and a second dielectric material is formed on the basis of the increased device topography, wherein the second dielectric material has the predefined type of intrinsic stress.

According to yet another illustrative embodiment disclosed herein, a semiconductor device comprises a transistor comprising a gate electrode and a channel region. Furthermore, a first placeholder structure is provided and is substantially aligned to the gate electrode. Additionally, the semiconductor device comprises a dielectric material enclosing the gate electrode and the first placeholder, wherein the dielectric material induces a predefined type of strain in the channel region.

BRIEF DESCRIPTION OF THE DRAWINGS

The disclosure may be understood by reference to the following description taken in conjunction with the accompanying drawings, in which like reference numerals identify like elements, and in which.

Figure 1A:
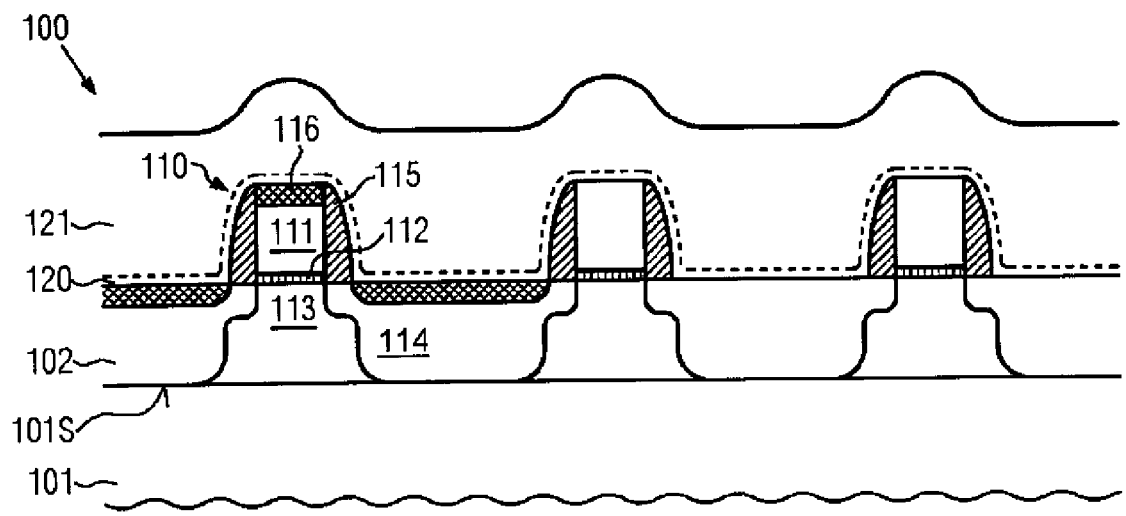
FIGS. 1a-1c schematically illustrate cross-sectional views of a semiconductor device during various manufacturing stages in forming respective dummy gates or placeholder structures above gate electrodes of transistors for increasing the amount of stressed dielectric material according to illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein relates to a technique for providing a semiconductor device, in which the device topography may be modified during the manufacturing sequence so as to provide the possibility for significantly increasing the stress transfer mechanism provided by a dielectric material that may be a part of an interlayer dielectric material for respective transistor elements, while substantially not unduly affecting the electrical characteristics, such as the fringing capacitance of the respective gate electrode. At the same time, the thickness of the stressed material may be significantly increased on the basis of well-established deposition techniques. As previously explained, the amount of strain finally induced in a respective channel region of a transistor element by an overlaying dielectric material may depend on the amount of intrinsic stress created therein, the thickness of the stressed dielectric layer, i.e., the amount of dielectric material formed above horizontal device portions adjacent to the respective gate electrode, and the height of the gate electrode. Consequently, by "increasing" the effective height of the gate electrode without increasing the "electrical height" thereof, the respective thickness of the dielectric stress material may be significantly increased. Moreover, since the corresponding increase in device topography may be performed in a step-wise manner with an intermediate deposition step for providing successive layers of the stressed dielectric material, a reliable, substantially void-free fill behavior may be achieved on the basis of well-established techniques, thereby also increasing the efficiency of the strain-inducing mechanism and also maintaining the reliability during the subsequent formation of any contact openings to be formed in the dielectric material so as to connect to respective transistor areas, such as the drain and source regions and the gate electrode. Furthermore, by locally modifying the amount of intrinsic stress of the corresponding dielectric material, an efficient mechanism may be provided for correspondingly adapting the strain in respective transistor devices. For instance, different types of strain may be readily generated for different transistor elements, such as P-channel transistors and N-channel transistors, wherein, additionally, the effective magnitude of each type of strain may also be locally adjusted by correspondingly adjusting the local intrinsic stress of the respective dielectric material.

Consequently, the subject matter disclosed herein is highly advantageous for sophisticated integrated circuits, since the performance of transistor elements may be efficiently increased in a highly localized manner, without requiring additional strain-inducing mechanisms. Hence, as will be explained later on in more detail, in some illustrative embodiments, well-established process techniques may be used to provide an efficient strain engineering technique substantially without requiring any complex process techniques in the transistor level, such as the formation of strained semiconductor materials and the like. In other cases, sophisticated nano-imprint techniques may be used in order to efficiently form respective aligned placeholder structures above the respective gate electrodes, thereby reducing the number of photolithography processes, which may contribute to a highly efficient process technique. It should be appreciated, however, that the subject matter disclosed herein may also be combined with other strain-inducing mechanisms, if required, wherein a high degree of compatibility with these additional strain-inducing mechanisms may be achieved, since the subject matter disclosed herein is substantially effective above the transistor level, thereby requiring substantially no process modifications during preceding manufacturing sequences.

FIG. 1a schematically illustrates a semiconductor device 100 comprising a substrate 101, which may represent any appropriate substrate for forming thereabove an appropriate semiconductor layer 102, which may comprise, in some illustrative embodiments, a significant amount of crystalline silicon material, the conductivity of which may be locally enhanced by inducing a respective type of strain therein. The substrate 101 may, for instance, represent a silicon bulk substrate or may be provided as any appropriate carrier material having formed thereon the semiconductor layer 102, wherein, in some sophisticated applications, a buried insulating layer (not shown) may be formed in contact with the semiconductor layer 102 to provide electrical insulation in the vertical direction, i.e., between the substrate 101 and the semiconductor layer 102. In this respect, it should be appreciated that any positional statements, such as "above," "below," "lateral," "height" and the like, are to be considered as relative position information with respect to the substrate 101 and in particular with respect to a surface 101S thereof. That is, a "lateral" or "horizontal" direction is to be understood as a direction that is substantially parallel to the surface 101S. Similarly, a first layer or first structural feature is formed "above" a second layer or second structural feature, when a distance of the first layer or feature with respect to the surface 101S is greater than a respective distance of the second layer or feature with respect to the surface 101S. In this sense, the semiconductor layer 102 is formed "above" the substrate 101.

The semiconductor device 100 may further comprise one or more transistor devices 110, each of which may comprise a respective gate electrode 111 formed on a respective gate insulation layer 112, which separates the respective gate electrode 111 from a channel region 113. Furthermore, respective drain and source regions 114 having an appropriate vertical and lateral dopant profile may be provided in this manufacturing stage. In some illustrative embodiments, a respective sidewall spacer structure 115 may be located at sidewalls of the respective gate electrodes 111, while, in other illustrative embodiments, in this manufacturing stage, a corresponding sidewall spacer structure, which may have been used during the preceding manufacturing sequences, may be removed, except for a thin offset spacer (not shown). Furthermore, metal silicide regions 116 may be provided, if required, for instance on top of the respective gate electrodes 111 and in the drain and source regions 114. The transistors 110 may represent highly scaled transistor devices wherein a gate length, i.e., the horizontal dimension of the gate electrodes 111, may be 100 nm and significantly less, for instance approximately 50 nm or even less, while, in some device areas, a lateral distance between adjacent gate electrodes 111 may be in the range of several hundred nanometers and significantly less.

In this manufacturing stage, the semiconductor device 100 may further comprise an optional stop layer 120, which may, for instance, be comprised of silicon dioxide and which may act as an etch stop layer and/or a chemical mechanical polishing (CMP) stop layer during the subsequent process sequence. Furthermore, a first layer of stressed dielectric material 121 may be formed above the transistors 110 so as to enclose the respective gate electrodes 111. The first layer 121 may be comprised of a dielectric material having a high intrinsic stress of a specified type so as to induce a corresponding desired type of strain in the respective channel regions 113. For example, the first layer 121 may be comprised of silicon nitride, which may be provided with a high degree of intrinsic stress, the amount and type of which may be efficiently adjusted on the basis of respective process parameters during the deposition of the layer 121. For example, silicon nitride may be deposited with a high compressive stress with an amount of up to 2 GPa and even higher and may also be provided with high tensile stress with an amount of 1 GPa and significantly higher. In some illustrative embodiments, the layer 121 may be locally provided with a different type of intrinsic stress, as will be described later on in more detail.

A typical process flow for forming the semiconductor device 100 as shown in FIG. 1a may comprise the following processes. After providing the substrate 101 having formed thereabove the semiconductor layer 102, respective isolation structures (not shown), such as trench isolations and the like, may be formed on the basis of well-established techniques. Thereafter, the gate insulation layers 112 and the gate electrodes 111 may be formed. For this purpose, an appropriate insulating material may be deposited and/or formed by oxidation, possibly in combination with additional treatments, in order to obtain the desired thickness and dielectric characteristics. Next, a gate electrode material, such as polycrystalline silicon, doped or undoped, may be deposited on the basis of well-established techniques, such as low pressure chemical vapor deposition and the like. Next, an appropriate anti-reflective coating (ARC) may be formed in order to enhance the subsequent photolithography process, in which a respective resist mask may be patterned on the ARC material on the basis of advanced photolithography techniques. The resist mask may be reduced so as to exhibit the desired lateral dimensions in order to pattern the ARC material, which may also act as a hard mask. Thereafter, the gate electrode material may be patterned in order to transfer the respective lateral dimensions into the gate electrode material previously deposited. For this purpose, highly advanced etch techniques may be used. Thereafter, the further processing may be continued on the basis of well-established techniques for forming the drain and source regions 114 on the basis of a respective pre-form of the spacer structure 115 and finally the corresponding metal silicide regions 116, if required, may be formed on the basis of established process techniques using any appropriate refractory metal, such as nickel, cobalt, platinum, tungsten or combinations thereof.

Next, in some illustrative embodiments, the stop layer 120, which may be comprised of silicon dioxide when silicon nitride may be used for the first dielectric layer 121, may be deposited on the basis of well-established chemical vapor deposition (CVD) techniques. Next, the layer 121 may be deposited on the basis of plasma enhanced chemical vapor deposition (PECVD) techniques, thereby controlling respective process parameters, such as substrate temperature, deposition pressure, gas flow rates and in particular ion bombardment during the deposition in order to obtain the desired type and magnitude of intrinsic stress. That is, upon depositing dielectric material of the layer 121 on the respective deposition surface, such as the stop layer 120, the corresponding material being deposited may have the tendency for expanding or contracting, thereby increasingly applying a corresponding stress on the deposition surface and the underlying material layers, which may then finally result in a corresponding deformation or strain in the adjacent channel region 113. Consequently, by providing a thick stressed material, a corresponding increased amount of strain may be generated below the respective gate electrodes 111, wherein, however, an increased amount of stressed material above the gate electrode 111 may reduce the corresponding strain-inducing mechanism.

As previously explained, increasing the height of the gate electrodes 111 may be a less desirable option, since the highly complex process for patterning the gate electrodes 111 may require highly sophisticated process recipes to be newly developed or adapted while, additionally, the corresponding fringing capacitance of the respective gate electrodes 111 may also increase. Furthermore, in device regions having dense gate electrodes 111, as shown in FIG. 1a, the fill capability of the respective deposition techniques for forming the layer 121 may result in the creation of voids, when further increasing the respective aspect ratios for the spaces between the respective gate electrodes 111, thereby also reducing the efficiency of the strain-inducing mechanism and providing non-uniformity during subsequent contact etch sequences. Consequently, according to the subject matter disclosed herein, the transistor topography may be modified level for level, each level substantially corresponding to the topography as provided by the gate electrodes 111, thereby enabling a multi-step formation of two or more additional layers, such as the layer 121, while substantially avoiding the problems identified above. For this purpose, the surface topography obtained after the deposition of the first dielectric layer 121 at first may be efficiently reduced so as to obtain a substantially planar surface configuration, which may be accomplished, for instance, on the basis of chemical mechanical polishing (CMP) or by other strategies, such as etching and the like.

Figure 1B:
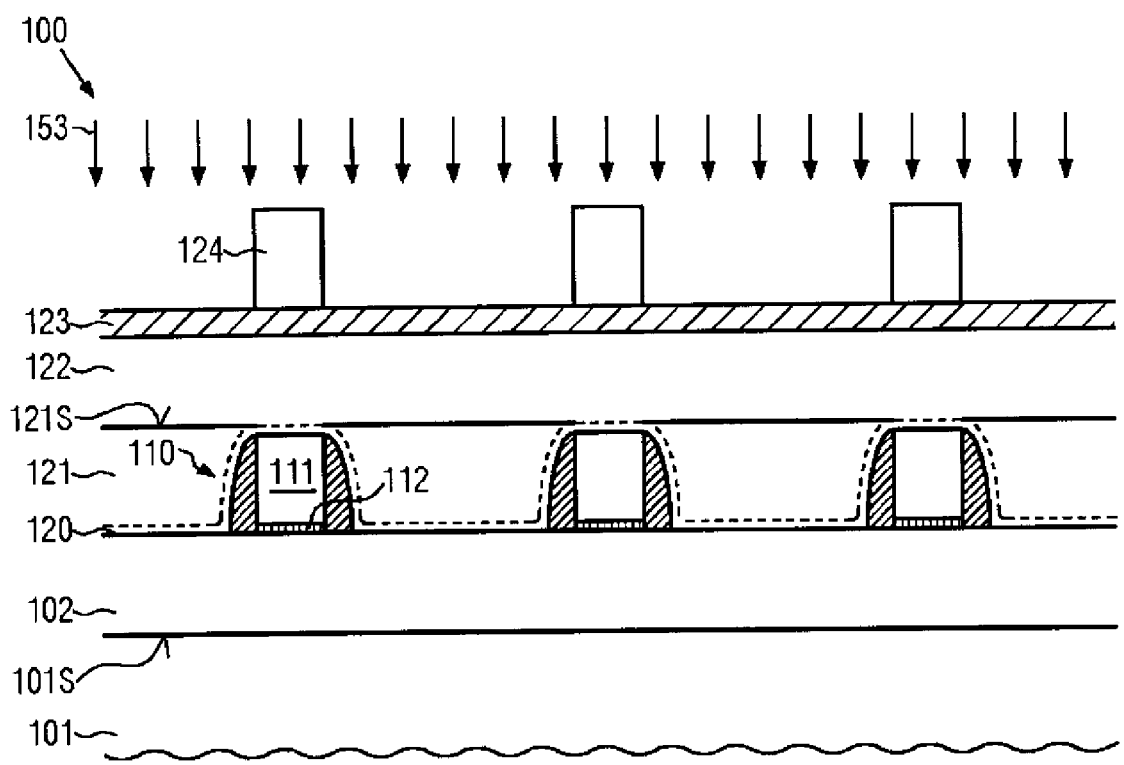

FIG. 1b schematically illustrates the semiconductor device 100 in a further advanced manufacturing stage. As shown, the first dielectric layer 121 may have a substantially planar surface 121S, on which may be formed an appropriate material 122, which may represent a dielectric material, a conductive material, such as a metal, a semiconductor material and the like. In one illustrative embodiment, the material 122 may be comprised of polysilicon so as to provide a similar process situation compared to the patterning of the gate electrodes 111. In other illustrative embodiments, the material 122 may be formed of an insulating material or a metal, as will be described later on. In some illustrative embodiments, the material 122 may be provided with an appropriate thickness that enables an appropriate lateral patterning of the material 122 in order to obtain substantially identical lateral dimensions, at least in the transistor length direction, i.e., in the horizontal direction of FIG. 1b. For example, the material 122, when comprised of the same material as the gate electrodes 111, may be deposited with substantially the same thickness. Furthermore, an appropriately selected ARC material 123 may be formed on the material 122, wherein the ARC layer 123 may have substantially the same characteristics as previously used for patterning the gate electrodes 111, when the material 122 is provided as substantially the same material as the gate electrode material. Furthermore, respective resist features 124 may be formed on the ARC layer 123 at positions that substantially correspond to the respective gate electrodes 111.

A typical process flow for forming the semiconductor device 100 as shown in FIG. 1b may comprise sophisticated deposition and patterning regimes, as may also be used for patterning respective gate electrodes, such as the gate electrodes 111. That is, depending on the material composition of the layers 122 and 123, appropriate deposition techniques may be used. Thereafter, highly advanced alignment techniques as are available in modern lithography tools may be used to appropriately position the respective resist features 124 above the gate electrodes 111 and corresponding trim etch processes may be subsequently performed to appropriately adjust the lateral dimensions of the resist features 124. Thereafter, a respective etch process 125 may be performed, transferring the dimensions of the resist features 124 into the material 122 so as to form a respective "dummy gate" or placeholder structure above the respective gate electrodes 111, or at least portions thereof.

Figure 1C:
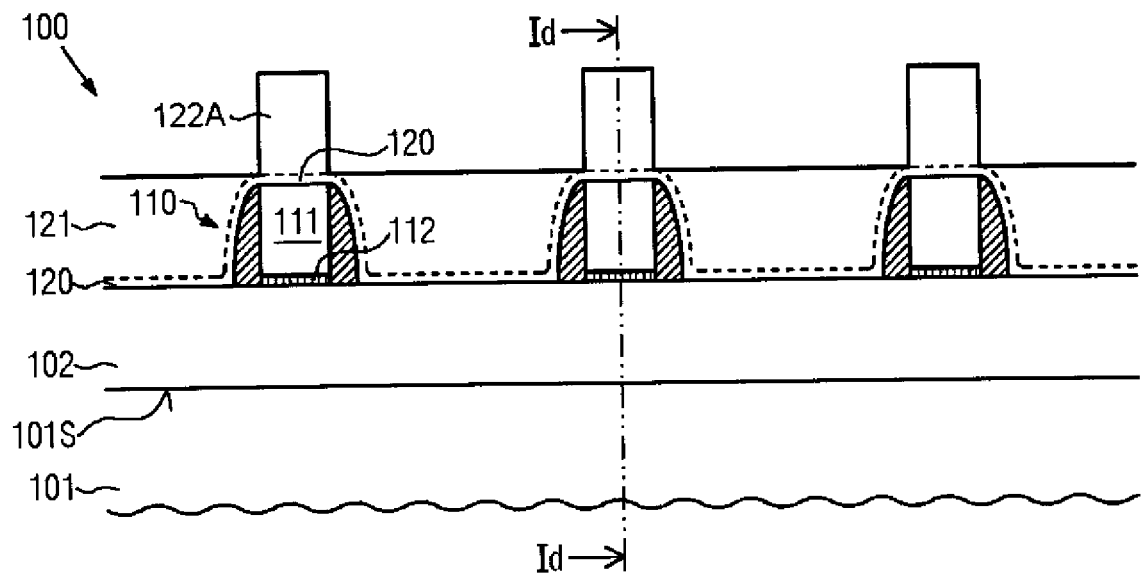

FIG. 1c schematically illustrates the semiconductor device 100 as a result of the etch process 125. Hence, respective placeholder structures 122A are formed above the gate electrodes 111 and substantially aligned thereto, thereby increasing the respective transistor topography in order to provide an additional layer of stressed dielectric material. In some illustrative embodiments, the process sequence described with reference to FIG. 1b may be performed as a copy of the corresponding patterning process for forming the gate electrodes 111 so that well-established process recipes may be used, thereby reducing process complexity. In this case, substantially the same lateral dimension of the placeholder structures 122A may be obtained in the transistor length direction, while a dimension of the placeholder structures 122A in the transistor width direction may be selected to be less compared to the respective extension of the gate electrodes 111 in order to not unduly affect the formation of respective contact plugs connecting to the gate electrode 111.

Figure 1D:
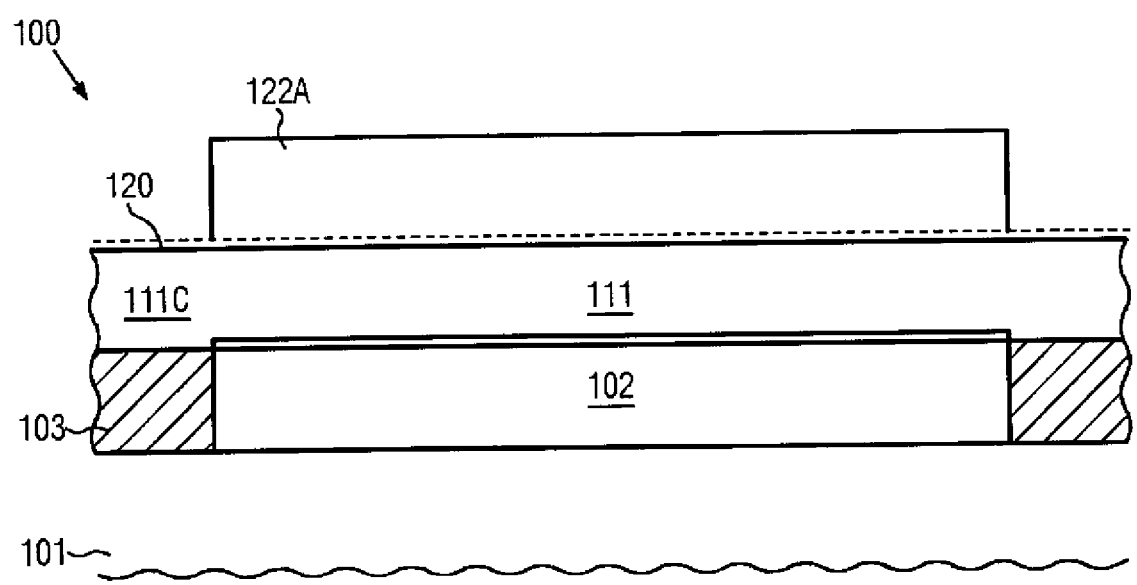
FIG. 1d schematically illustrates a cross-sectional view along the transistor width direction of a single transistor element having formed thereabove a placeholder structure with a length dimension less than corresponding length dimensions of the respective gate electrode according to one illustrative embodiment.

FIG. 1d schematically illustrates a respective cross-sectional view along the transistor width direction as indicated by the line 1d of FIG. 1c. As shown, the semiconductor device 100 may comprise respective isolation structures 103, such as shallow trench isolations, above which at least a portion of the respective gate electrodes 111 may be provided. For instance, above one of the isolation structures 103, a respective contact area 111C of the gate electrode 111 may be provided. In order to avoid the risk of electrically contacting the placeholder structure 122A during the formation of a respective contact plug to the contact area 111C, the lateral dimension along the transistor width direction may be restricted to substantially the region between the respective isolation structures 103, while the stop layer 120 or any additional material layer of the layer 121 may provide an efficient dielectric isolation between the gate electrode 111 and the placeholder structure 122A.

Figure 1E:
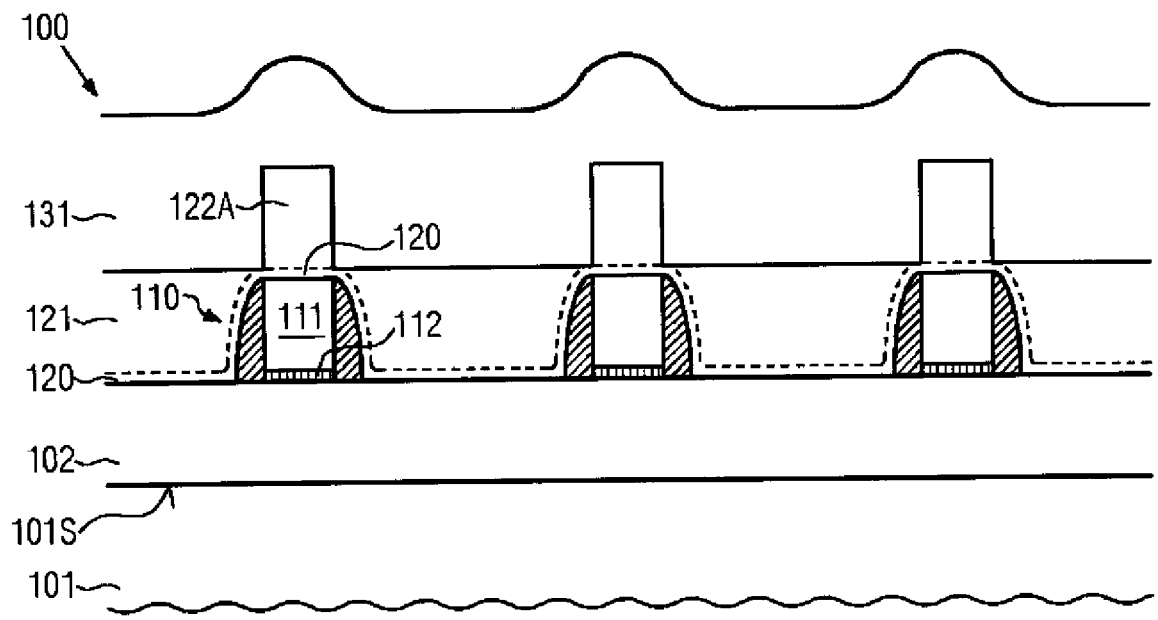
FIGS. 1e-1f schematically illustrate cross-sectional views during various manufacturing stages in forming additional placeholder structures aligned to the gate electrode for forming a plurality of placeholder levels according to further illustrative embodiments.

FIG. 1e schematically illustrates the semiconductor device 100 in a cross-sectional view along the transistor length direction. Furthermore, a second dielectric layer 131 is formed above the device 100 on the basis of the increased surface topography provided by the placeholder structures 122A. The second dielectric layer 131 may be formed on the basis of substantially the same process techniques as previously described with respect to the layer 121, wherein the corresponding process parameters may be controlled so as to obtain a certain amount of the specified stress. Furthermore, in some illustrative embodiments, the material of the layer 131 may be provided without any additional stop layers, since, for the subsequent planarizing of the layer 131, the respective placeholders 122A may themselves be used as appropriate features for controlling a respective planarization process. For example, a CMP process may be performed, wherein the exposure of the respective placeholder structures 122A may be used as an indicator for efficiently controlling the corresponding CMP process.

Figure 1F:
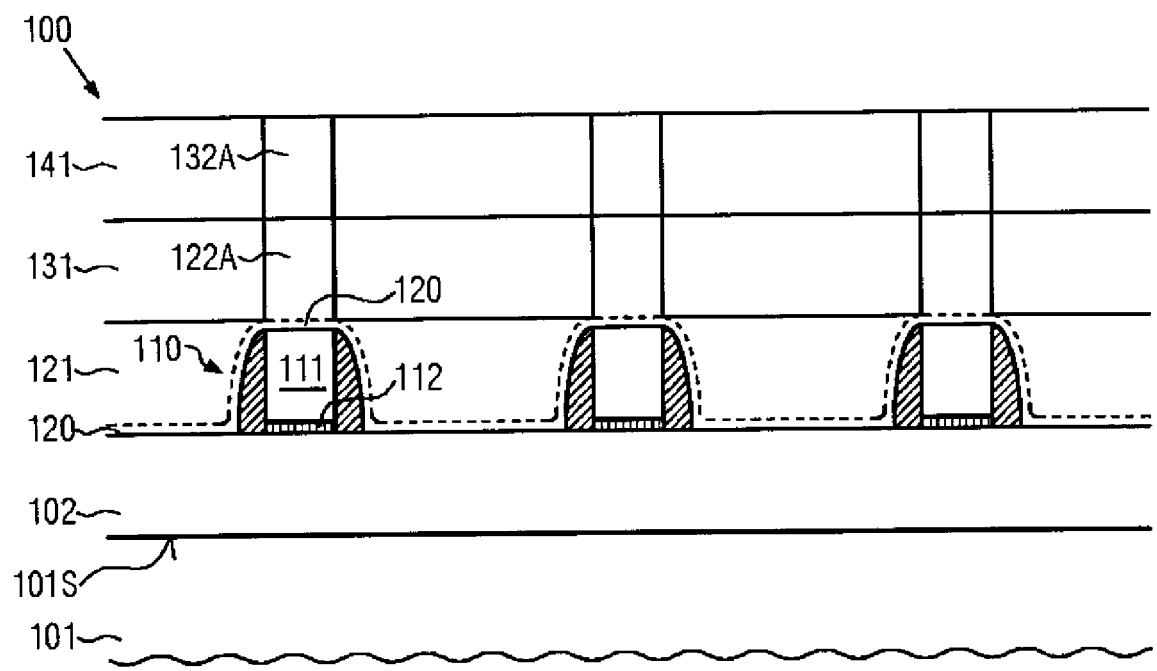

FIG. 1f schematically illustrates the semiconductor device 100 in a further advanced manufacturing stage, when an additional increase of the respective strain may be required. In this case, after planarizing the second dielectric layer 131, the resulting substantially planar topography may then again be locally increased in the respective transistors 110 by forming a further placeholder structure 132A, which may have substantially the same dimensions as the placeholder structures 122A and may be appropriately aligned therewith, which may be accomplished on the basis of process techniques as previously described with reference to the placeholder structures 122A. Thereafter, a further dielectric material 141 having the desired type of stress may be formed as is also explained with reference to the layers 121 and 131. Hence, the corresponding overall thickness of stressed dielectric material may be adjusted on the basis of the corresponding number of stacked placeholder structures 122A, 132A and/or the height of the individual levels of the placeholder structures 122A, 132A. It should be appreciated that the finally obtained magnitude of strain in the respective channel regions 113 may be locally modified by, for instance, locally performing strain relaxation processes, such as ion implantation, in order to provide a lateral profiling of the corresponding strain. For instance, in a device region requiring a less pronounced strain in the respective transistor elements, a corresponding ion bombardment may be performed to modify the corresponding material structure in the layer stack 131, 141 without unduly affecting the characteristics of the transistor elements, while other device regions may be effectively covered by a corresponding implantation mask, such as a resist mask and the like.

Figure 1G:
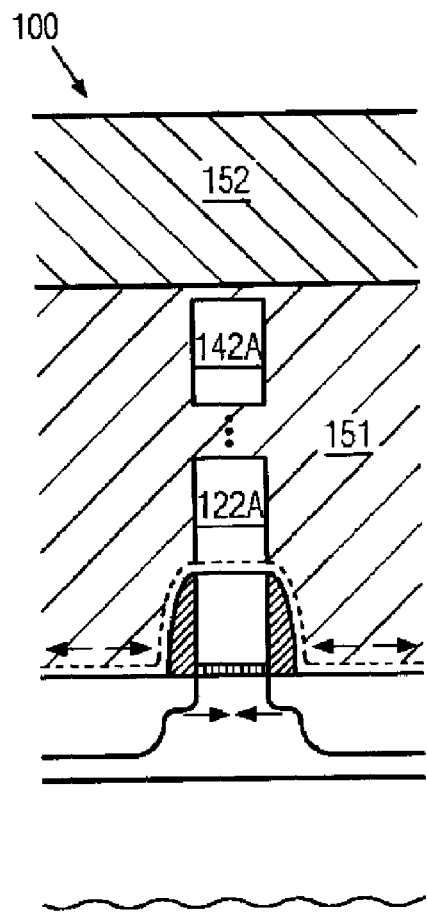
FIGS. 1g-1h schematically illustrate cross-sectional views along the transistor width direction of a further illustrative embodiment.

FIG. 1g schematically illustrates the semiconductor device 100 according to a further illustrative embodiment, wherein a plurality of respective placeholder structures, indicated as 122A . . . 142A, are stacked above respective transistor elements, wherein, for convenience, a single transistor 110 is illustrated. Thus, by providing "n" placeholder structures 122A . . . 142A, a corresponding thickness of the first layer 121 may be multiplied by n, when the placeholder structures 122A . . . 142A have substantially the same height as the gate electrode 111, thereby providing a highly increased strain in the channel region 113. It should be appreciated that the first placeholder structure 122A, when comprised of a conductive material, may be efficiently insulated from the gate electrode 111 by the stop layer 120 or respective material of the layer 121, as previously described, while a respective insulation may not be required for the further placeholder structures. That is, the corresponding planarization processes may not require maintaining insulating material between individual stacked placeholder structures, thereby reducing the amount of stressed material formed above individual placeholder structures and/or avoiding the provision of any intermediate material within the stacked dielectric layers 121, 131 and the like. In other illustrative embodiments, respective stop or indicator layers may be intentionally provided at the various device levels, when a corresponding etch process through the entirety of stressed dielectric material, collectively indicated as 151, may be considered inappropriate. Thus, in this case, the dielectric layer 151 may be etched in discrete steps, thereby increasing the overall controllability of the respective etch process for forming respective contact openings.

The device 100 may further comprise an interlayer dielectric material 152 which may be provided in a low stressed condition while also having the desired mechanical and other characteristics. For instance, the interlayer dielectric material 152 may be provided as silicon dioxide formed from TEOS on the basis of well-established techniques, such as CVD with high plasma density, sub-atmospheric deposition processes and the like, so that the material 152 may provide a high resistance against penetration of moisture into lower lying device regions, thereby stabilizing the long-term reliability of the stressed dielectric material 151. Based on the device configuration as shown in FIG. 1g, respective contact openings may be formed, wherein, in a first etch step, the interlayer dielectric material 152 may be opened, wherein the layer 151 may act as an efficient etch stop layer. Thereafter, the stressed layer 151 may be etched on the basis of an appropriate etch chemistry, wherein at least the stop layer 120 may provide a corresponding control of the etch process, when a corresponding contact of the etch chemistry with the drain and source regions 114 or any metal silicide regions 116 formed thereon is deemed inappropriate.

Figure 1H:
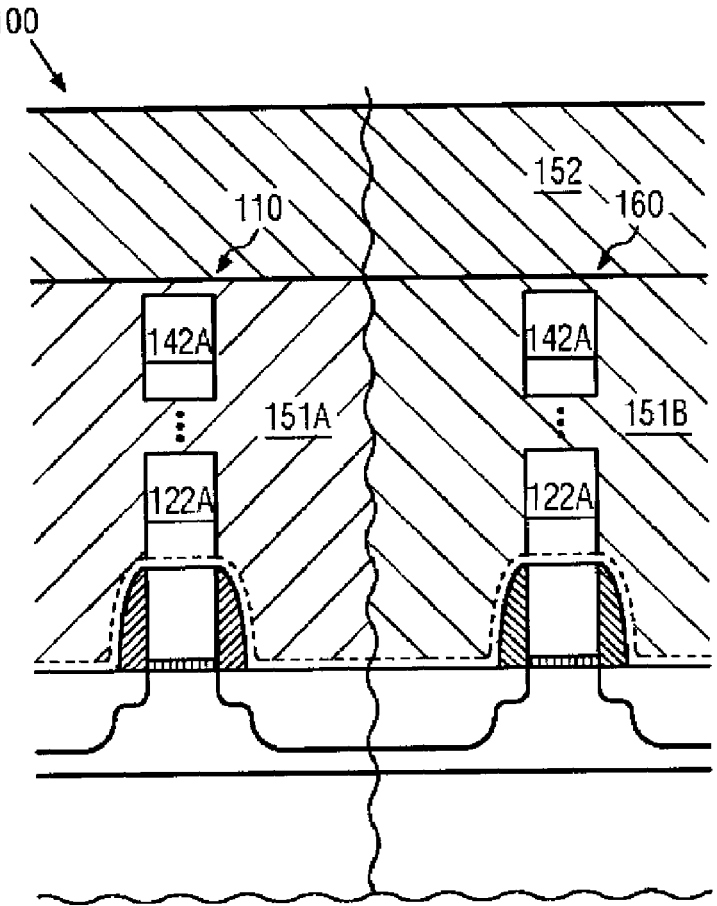

FIG. 1h schematically illustrates the semiconductor device 100 according to further illustrative embodiments, in which the transistor 110 may have formed thereabove a plurality of placeholder structures 122A . . . 142A embedded into a stressed dielectric material 151A having a first type of intrinsic stress, while a second transistor 160 may have formed thereabove the respective placeholder structures 122A . . . 142A embedded into a stressed dielectric material 151B having a different type of intrinsic stress. For example, the transistor 110 may represent an N-channel transistor, wherein the stressed dielectric material 151A may create a corresponding tensile strain in the channel region 113 for increasing the electron mobility therein. Similarly, the transistor 160 may represent a P-channel transistor, wherein the stressed dielectric material 151B may create a corresponding compressive strain in the respective channel region 113, thereby enhancing the hole mobility therein. As previously indicated, the corresponding stress components of the materials 151A, 151B may be locally varied in order to take into consideration the respective constraints imposed by different device regions, such as static RAM memory areas compared to logic blocks and the like. Furthermore, since the increased amount of stressed dielectric material that may be provided above the respective transistors 110, 160 provides an efficient strain-inducing mechanism without necessitating other strain-inducing mechanisms, the corresponding transistor characteristics may be finely tuned with respect to N-channel transistors and P-channel transistors by appropriately selecting the corresponding intrinsic stress of respective dielectric materials. That is, a highly symmetric performance gain may be obtained for P-channel transistors and N-channel transistors by individually adapting a corresponding stress level in the dielectric materials, which may be accomplished during the deposition and/or in subsequent stress relaxation processes. For example, compressively stressed silicon nitride may be provided with higher intrinsic stress compared to tensile silicon nitride. Thus, since a corresponding difference in transistor performance may be generated due to the higher compressive stress, the corresponding adaptation of the device topography may be performed with respect to the overall tensile strain required, wherein, additionally, respective deposition parameters and/or subsequent stress relaxation processes may be performed above the compressive dielectric materials so as to finely tune the overall compressive strain.

Figure 2A:
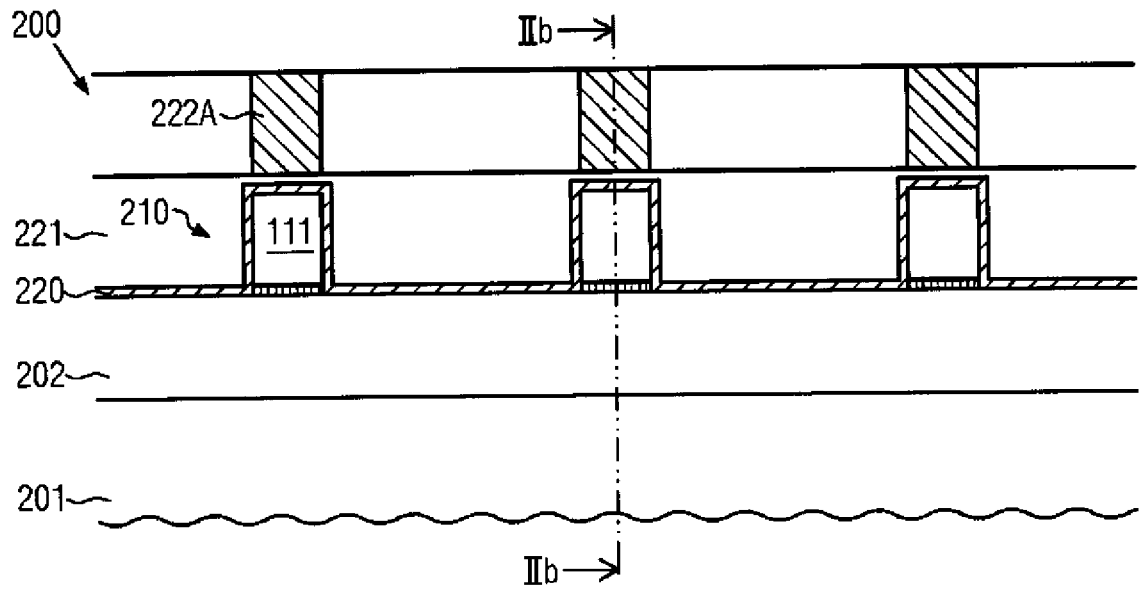
FIGS. 2a-2c schematically illustrate cross-sectional views of a semiconductor device during various manufacturing stages for forming placeholder structures having substantially the same lateral dimensions compared to the respective gate electrodes in accordance with further illustrative embodiments.
Figure 2B:
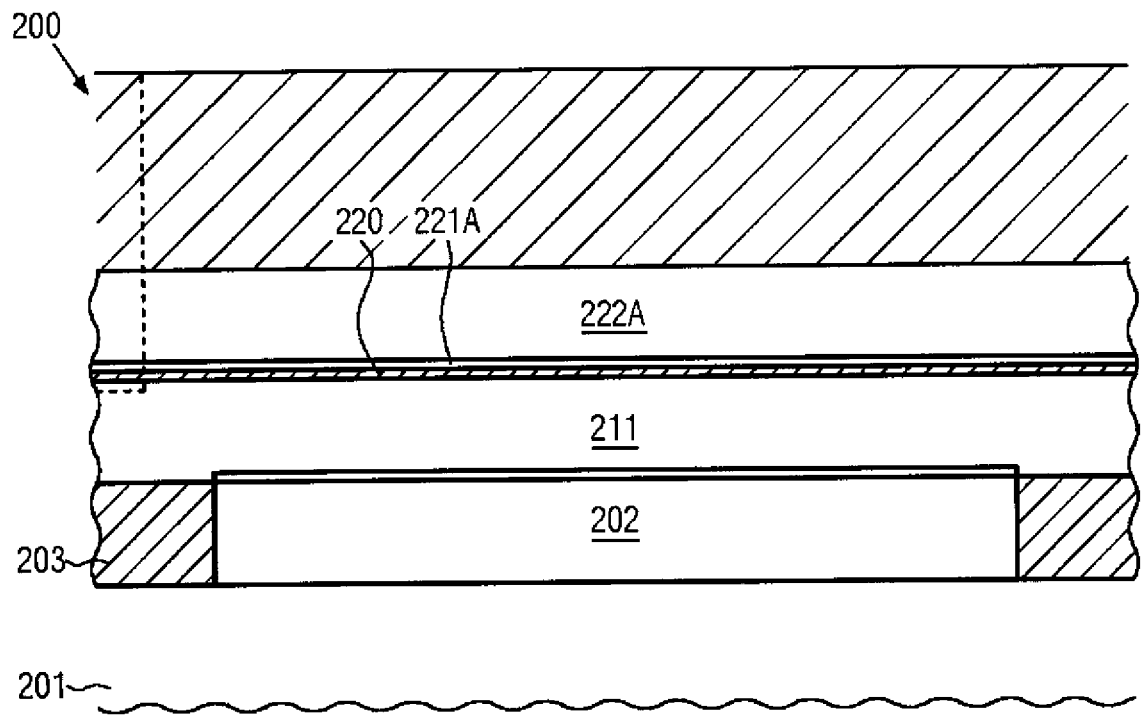
Figure 2C:
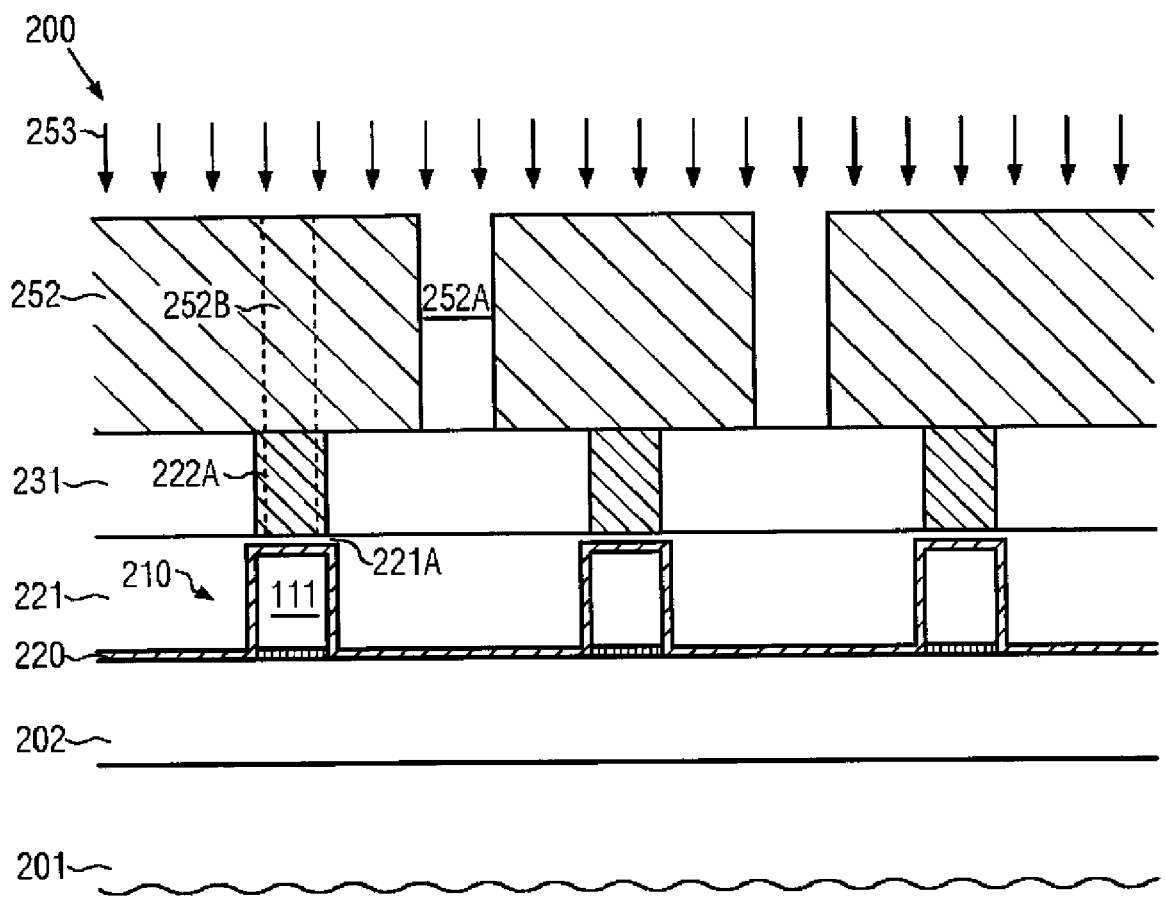

With reference to FIGS. 2a-2c, further illustrative embodiments will now be described, in which corresponding placeholder structures may be formed on the basis of substantially the same lateral dimensions as the respective gate electrodes, wherein at least the first placeholder structure formed above the gate electrode may be comprised of an electrically insulating material in order to not unduly increase the corresponding fringing capacitance.

FIG. 2a schematically illustrates a semiconductor device 200 comprising a substrate 201 having formed thereabove an appropriate silicon-based semiconductor layer 202. With respect to the substrate 201 and the semiconductor layer 202 and a corresponding configuration, such as an SOI architecture and the like, the same criteria apply as previously explained with reference to the semiconductor device 100. Furthermore, a plurality of transistor devices 210 may be formed in and on the semiconductor layer 202, wherein the transistor devices 210 may have substantially the same configuration as previously described with reference to the device 100. Respective gate electrodes 211 may be covered by a respective stop layer 220, which may be comprised of silicon dioxide or any other appropriate material. It should be appreciated that, as previously explained, respective sidewall spacer structures (not shown) may be provided at sidewalls of the gate electrodes 211, if required. Furthermore, a first stressed dielectric layer 221 is formed so as to enclose the gate electrodes 211, followed by a second dielectric layer 231, in which are formed respective placeholder structures 222A having substantially the same lateral dimensions in the transistor length direction and the transistor width direction as the corresponding gate electrodes 211. Furthermore, the respective placeholder structures 222A may be separated from the gate electrodes 211 by the stop layer 220 and an additional layer 221A (FIG. 2b), which may represent a portion of the layer 221 or which may represent an additional etch stop layer, which may be formed of substantially the same material as the layer 221.

FIG. 2b schematically illustrates the semiconductor device 200 in a cross-sectional view taken along the transistor length direction. As shown, the respective placeholder structure 222A may extend along the entire width of the gate electrode 211. Hence, identical lithography masks may be used for forming the respective placeholder structures 222A.

A typical process flow for forming the semiconductor device 200 as shown in FIGS. 2a-2b may comprise the following processes. After forming the respective transistors 210 on the basis of well-established techniques, as previously described with reference to the device 100, the stop layer 220 may be formed, for instance on the basis of well-established CVD processes for providing, for instance, silicon dioxide followed by the deposition of a silicon nitride material having the desired degree and type of intrinsic stress, as previously explained. Thereafter, a corresponding planarization process may be performed, for instance by CMP, wherein the layer 221A may be maintained above the respective gate electrodes 211. In other illustrative embodiments, the stop layer 220 may be used as an efficient control layer for detecting the endpoint of the respective CMP process. Thereafter, the layer 221A may be provided as an additional etch stop layer, which may be provided with the same type and magnitude of intrinsic stress or which may be provided as a substantially relaxed layer, depending on the device requirements. Next, an appropriate material may be deposited, for instance silicon dioxide, which may then be patterned on the basis of the same lithography masks compared to the gate electrodes 211, thereby reducing the number of lithography masks required for the overall manufacturing sequence for the device 200. The patterning process may be appropriately adapted to the dielectric material, for instance the silicon dioxide, by selecting an appropriate ARC material, which may then be used for the subsequent lithography process. Thereafter, the respective placeholder structures 222A may be formed on the basis of appropriately designed anisotropic etch techniques, using the layer 221A as an efficient etch stop layer. Next, a further stressed dielectric material may be deposited and may be planarized, as previously explained, in order to form the second dielectric layer 231. If required, the respective device topography may be increased for forming a further level of dielectric material, as is previously explained.

FIG. 2c schematically illustrates the semiconductor device 200 in a further advanced manufacturing stage. Here, an interlayer dielectric material 252 is formed above the stressed dielectric material comprised of the layers 221 and 231 including the gate electrodes 211 and the respective placeholder structures 222A aligned therewith. The interlayer dielectric material 252 may be comprised of silicon dioxide or any other appropriate dielectric material. In some illustrative embodiments, the placeholder structures 222A and the interlayer dielectric material 252 may be comprised of substantially the same material or at least of a material having substantially the same etch characteristics with respect to a specific etch process 253 for forming respective portions of contact openings 252A in the interlayer dielectric material 252 and respective contact openings 252B extending to respective contact areas of the gate electrode 111 that may be provided above respective isolation structures, as is also previously explained with reference to FIG. 1c.

The interlayer dielectric material 252 may be formed on the basis of well-established recipes and well-established recipes may be applied for the anisotropic etch process 253. Thus, the etch front of the process 253 may reliably stop at the stressed dielectric layer 231, while further proceeding above the respective contact areas of the gate electrodes 211 due to the similar etch behavior of the placeholder structures 222A with respect to the interlayer dielectric material 252. Upon reaching the layer 221A, the etch process for the contact opening 252B may be reliably stopped. Thereafter, the process 253 may include a further etch step for anisotropically etching through the stack of layers 221, 231 and also through the layer 221A, wherein the stop layer 220 may provide the required etch selectivity in order to not unduly affect the respective gate electrodes 211. Thereafter, the stop layer 220 may be opened above the gate electrodes 211 and respective drain and source areas of the transistors 210. Thus, a highly efficient process sequence may be established, in which the number of lithography masks may be identical to a respective mask set required for a conventional process technique, while nevertheless providing a significantly enhanced strain-inducing mechanism. It should further be appreciated that, in these embodiments, a plurality of respective placeholder structures may also be stacked in order to adjust the desired magnitude and type of strain in the respective channel regions.

Figure 3A:
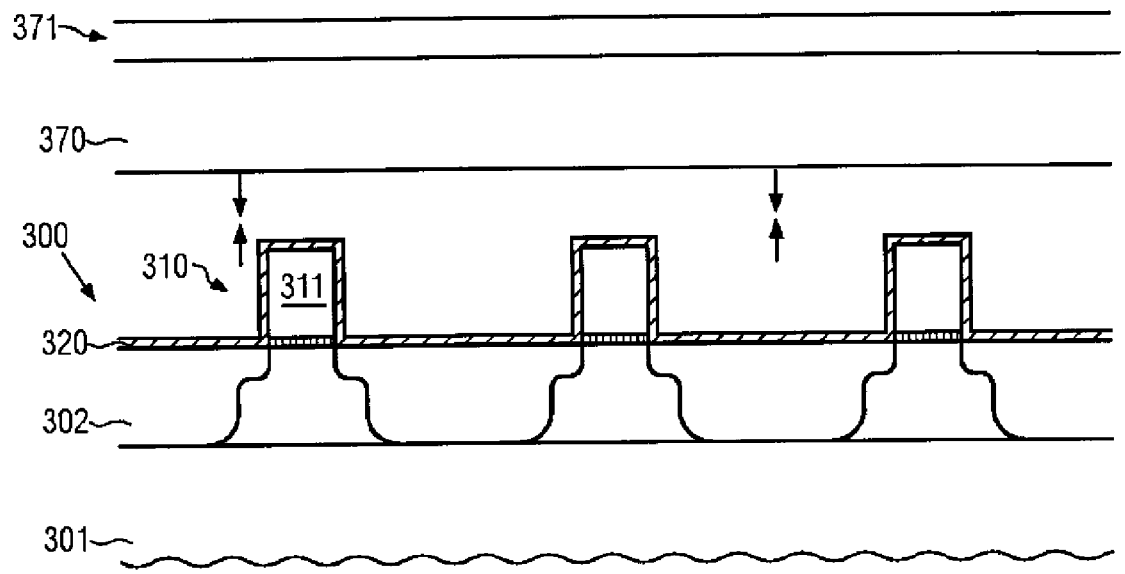
FIGS. 3a-3c schematically illustrate cross-sectional views of a semiconductor device during various manufacturing stages, in which a placeholder structure may be formed on the basis of nano-imprint techniques according to still further illustrative embodiments disclosed herein.
Figure 3B:
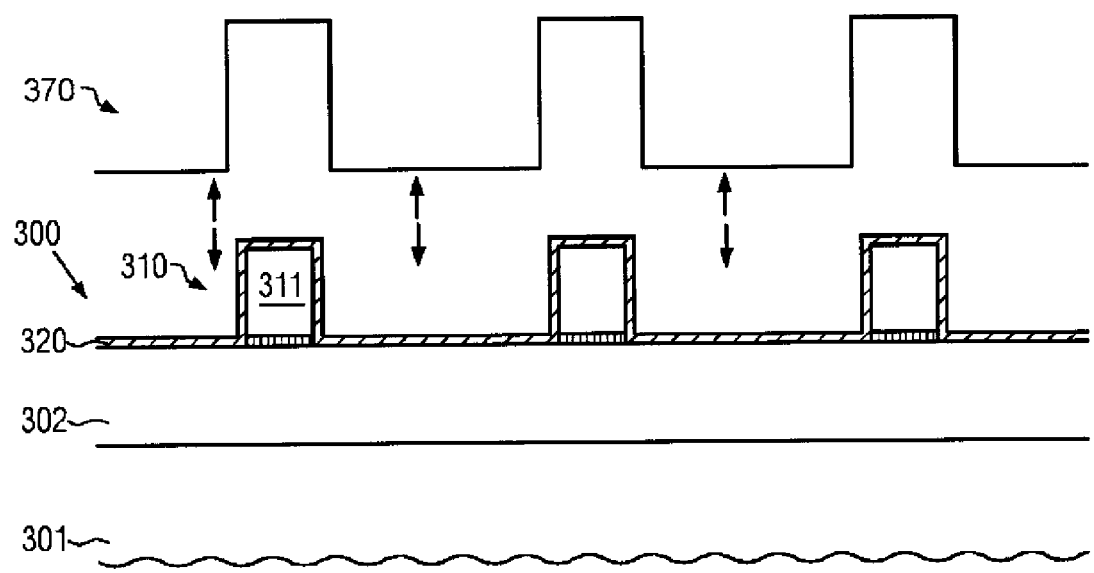
Figure 3C:
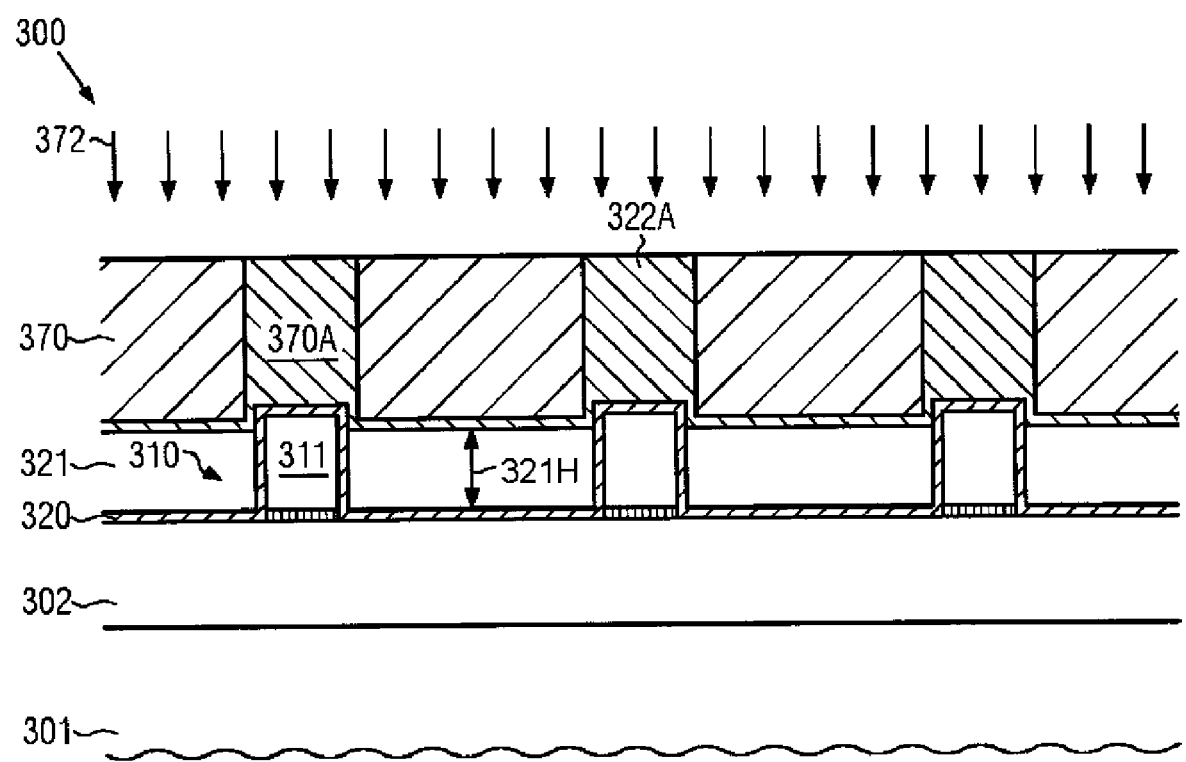

With reference to FIGS. 3a-3c further illustrative embodiments will now be described in which the patterning of the respective placeholder structures may be based on an imprint technique, thereby reducing production complexity with respect to photolithography processes, alignment and the like.

FIG. 3a schematically illustrates a semiconductor device 300 comprising a substrate 301 having formed thereabove a semiconductor layer 302 in and on which are formed respective transistor elements 310. The transistors 310 may comprise respective gate electrodes 311, which may be covered by a respective stop layer 320. With reference to the components 301, 302, 320, 310 and 311 of the device 300, the same criteria apply as previously explained with reference to the devices 100 and 200. In this manufacturing stage, the semiconductor device 300 may be brought into contact with a corresponding deformable material layer 370, which may be provided on a respective substrate 371. The deformable material 370 may represent any appropriate material as may be used in nano-imprint techniques so as to allow the deformation thereof upon contact with a respective "imprint" die and which may thereafter be brought into a highly non-deformable state to maintain the resulting topography. It should be appreciated that a plurality of respective materials, such as thermoplastic materials, moldable resists or any other polymer materials, may be available for this purpose. Thus, the semiconductor device 300 may act as an imprint die in order to efficiently transfer the respective surface topography provided by the gate electrodes 311 into the deformable layer 370. To this end, the substrates 370 and 301 may be moved relatively to each other. Thereafter, the deformable material 370 may be brought into a highly non-deformable state, for instance by curing, radiation treatment, heat treatment and the like.

FIG. 3b schematically illustrates the semiconductor device 300 during removing the substrate 371 including the material layer 370 in its highly non-deformable state, which may now have "imprinted" thereon the surface topography of the device 300. Consequently, the layer 370 may include the spatial information regarding the characteristics of the gate electrodes 311 with respect to lateral dimensions, spacings and the like, so that the corresponding layer 370 may then act as a mask layer for appropriately patterning respective placeholder structures with a high degree of alignment fidelity due to the "conserved" spatial information transferred into the material layer 370.

FIG. 3c schematically illustrates the semiconductor device 300 in a further advanced manufacturing stage. In the embodiment shown, the device 300 may comprise, in this manufacturing stage, a first layer of stressed dielectric material 321, which may be formed, in one illustrative embodiment, with a height 321H so as to expose at least a portion of the gate electrodes 311. Furthermore, the mask layer 370 may be placed above the layer 321 and the gate electrodes 311, wherein a high degree of alignment accuracy may be accomplished, since the previously "stored" spatial information may provide a high degree of alignment fidelity. For example, respective mechanical or optical alignment marks may be used for appropriately positioning the mask layer 370 with respect to the gate electrodes 311. In other cases, the gate electrodes 311 themselves may act as mechanical alignment marks for fine-tuning the position of the mask layer 370.

The semiconductor device 300 including the mask layer 370 may be formed according to the following processes. After providing the transistors 310 on the basis of manufacturing sequences, as previously described with reference to the devices 100 and 200, the stop layer 320 may be formed, for instance comprised of silicon dioxide, on the basis of well-established techniques. Thereafter, the stressed dielectric material may be deposited on the basis of processes, as previously described, followed by a planarization process, such as CMP and the like, wherein, additionally, material of the layer 321 may be selectively removed on the basis of well-established etch techniques so as to obtain the desired surface topography as shown in FIG. 3c. That is, after planarizing the material 321, a controlled selective etch process may be performed in order to remove a desired amount of material to thereby expose the respective surface portions of the gate electrode 311. In other illustrative embodiments, when the additional mechanical self-adjusting mechanism from the gate electrodes 311 may not be required, a substantially planar surface configuration may be provided, as is previously described with respect to the device 100 and 200. Thereafter, the corresponding mask layer 370 may be aligned to the gate electrodes 311, wherein the respective alignment process may be performed with high accuracy even across extended surface portions of the substrate 301, when substantially identical environmental conditions may be established during the mask forming process and the aligning process. After placing the mask layer 370 on top of the device 300, which may include, in some illustrative embodiments, the provision of additional adhesion materials and the like, the mask layer 370 may be used for the patterning of respective placeholder structures, which may be aligned to the respective gate electrodes 311.

In one illustrative embodiment, the substrate 371 may be removed, for instance by CMP, so as to open the respective openings in the mask layer 370 from the "backside," thereby exposing the respective gate electrodes 311. In this case, a corresponding deposition process 372 may be performed, for instance by any appropriate deposition technique, such as CVD, spin-on techniques and the like, in order to fill in an appropriate material into the respective openings 370A. Thereafter, any excess material created by the deposition process 372 may be removed on the basis of well-established techniques and subsequently the mask layer 370 may be selectively removed with respect to the corresponding material filled into the openings 370A. In other illustrative embodiments, the respective openings 370A may be filled with an appropriate material, and thereafter the mask layer 370 including the filled openings 370A may be positioned above the device 300, wherein the corresponding adhesion of this material to the underlying gate electrodes 311 may be obtained by an appropriate treatment. For example, after positioning the mask layer 370 above the gate electrodes 311, the corresponding material contained in the respective openings may be cured so as to obtain the desired degree of adhesion. Thereafter, the mask layer 370 and the substrate 371 may be removed. In illustrative embodiments, as shown in FIG. 3c, the mask layer 370 may be selectively removed with respect to the material contained in the openings 370A, thereby producing respective placeholder structures 322A. Consequently, the respective device topography of the respective transistors 310 may be increased in order to prepare the device for the subsequent deposition of a further material layer having a high intrinsic stress, as is previously explained. Similarly, a further process sequence may be repeated, for example in some illustrative embodiments on the basis of the same mask layer 370, when maintained during the preceding process sequence, or by forming a respective further mask layer, as is previously described. The further patterning of the resulting dielectric layer stack may then be performed, as is previously described with reference to FIGS. 2a-2c. Thus, a highly efficient process technique may be provided, in which the number of photolithography steps may be comparable to conventional strategies while nevertheless providing an efficient increase of the device topography in a step-wise fashion, thereby providing the potential for correspondingly increasing the layer thickness of a stressed dielectric material.

As a result, the subject matter disclosed herein provides a semiconductor device including a significantly increased thickness of stressed dielectric material placed over a transistor element in order to increase the respective strain in the channel region thereof. For this purpose, the device topography may be appropriately increased in discrete manufacturing stages, thereby allowing an intermittent deposition of an appropriately stressed dielectric material, while not unduly imposing additional constraints with respect to gate patterning and fill capabilities of conventional process techniques. Hence, level by level, an appropriately aligned placeholder structure may be formed followed by the deposition of a stressed dielectric material, thereby significantly enhancing the resulting strain in the respective channel region. Thus, well-approved process techniques may be used with a high degree of compatibility with process techniques used at the transistor level, while eliminating the necessity for additional strain-inducing mechanisms, such as strained embedded semiconductor materials and the like. By providing an insulating material for the respective placeholder structures, electrical contact of the respective placeholder structure to the gate electrode may be avoided, thereby not unduly contributing to the fringing capacitance of the gate electrodes. In other illustrative embodiments, the corresponding lateral dimension of the placeholder structure in the transistor width dimension may be appropriately restricted so as to allow the employment of well-established gate electrode materials, such as polycrystalline silicon, without adding to an increased fringing capacitance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a first dielectric layer above a transistor having a gate electrode, said first dielectric layer having a predefined type of intrinsic stress;
planarizing said first dielectric layer;
forming a first placeholder structure above said gate electrode after planarizing said first dielectric layer to locally increase a device height above said gate electrode; and
forming a second dielectric layer above said transistor and said first placeholder structure, said second dielectric layer having said predefined type of intrinsic stress.

2. The method of claim 1, wherein a lateral dimension of said first placeholder structure in a transistor width dimension is less than an extension of said gate electrode.

3. The method of claim 1, further comprising forming a second placeholder structure above said first placeholder structure and forming a third dielectric layer above said second dielectric layer, said third dielectric layer having said predefined intrinsic stress.

4. The method of claim 1, further comprising forming an interlayer dielectric material above said first and second dielectric layers and forming contact openings in said interlayer dielectric material and said first and second dielectric layers.

5. The method of claim 1, wherein said first placeholder structure is formed on the basis of a process sequence that is substantially the same as a process sequence for forming said gate electrode.

6. The method of claim 1, wherein said first placeholder structure is formed by transferring a topography of said transistor to a mask layer and using said mask layer for aligning and patterning said first placeholder structure.

7. The method of claim 1, wherein forming said first placeholder structure comprises forming a material layer above said transistor and performing a patterning process on said material layer on the basis of a lateral target dimension in the transistor length direction that substantially corresponds to a gate length of said gate electrode.

8. The method of claim 7, wherein patterning said material layer comprises performing a photolithography process.

9. A method, comprising:
forming a first dielectric material adjacent to a channel region of a transistor, said first dielectric material exhibiting a predefined type of intrinsic stress;
planarizing said first dielectric material;
locally increasing a device topography above a gate electrode of said transistor after planarizing said first dielectric layer; and
forming a second dielectric material above said first dielectric layer on the basis of said increased device topography, said second dielectric material having said predefined type of intrinsic stress.

10. The semiconductor device of claim 9, further comprising a second placeholder structure formed above said first placeholder structure and aligned therewith, said dielectric material enclosing said second placeholder structure.

11. The method of claim 9, wherein increasing said device topography comprises forming at least one placeholder structure above a portion of said gate electrode, said at least one placeholder structure and said gate electrode being electrically insulated from each other.

12. The method of claim 11, wherein forming said at least one placeholder structure comprises performing a photolithography process on the basis of critical length dimension corresponding to a critical dimension of a length of said gate electrode.

13. The method of claim 12, wherein a critical dimension of a width of said at least one placeholder structure is less than a width of said gate electrode.

14. The method of claim 9, wherein locally increasing said device topography comprises contacting said transistor with a mask layer and imaging a device topography into said mask layer prior to forming said first dielectric material.

15. The method of claim 14, further comprising using said mask layer as a deposition mask for depositing a material for increasing said device topography after forming said first dielectric material.

16. The method of claim 14, wherein said mask layer is used as a mask during a wet chemical deposition process.

17. A semiconductor device, comprising:
a transistor comprising a gate electrode and a channel region;
a first placeholder structure positioned above and substantially aligned with said gate electrode; and
a dielectric material enclosing said gate electrode and said first placeholder structure, said dielectric material inducing a predefined type of strain in said channel region and comprising a first layer substantially coplanar with respect to a top surface of said gate electrode and a second layer enclosing said first placeholder structure.

18. The semiconductor device of claim 17, wherein said first placeholder structure is comprised of a conductive material and wherein a width of said first placeholder structure is less than a width of said gate electrode.

19. The semiconductor device of claim 17, wherein first placeholder structure is comprised of an insulating material.

20. A method, comprising:
forming a first dielectric layer above a transistor having a gate electrode, said first dielectric layer having a predefined type of intrinsic stress;
forming a first placeholder structure above said gate electrode to locally increase a device height above said gate electrode;
forming a second dielectric layer above said transistor and said first placeholder structure, said second dielectric layer having said predefined type of intrinsic stress;
forming a second placeholder structure above said first placeholder structure; and
forming a third dielectric layer above said second dielectric layer, said third dielectric layer having said predefined intrinsic stress.

21. A semiconductor device, comprising:
a transistor comprising a gate electrode and a channel region;
a first placeholder structure positioned above and substantially aligned with said gate electrode;
a dielectric material enclosing said gate electrode and said first placeholder structure, said dielectric material inducing a predefined type of strain in said channel region; and
a second placeholder structure formed above said first placeholder structure and aligned therewith, said dielectric material enclosing said second placeholder structure.

* * * * *

UNITED STATES PATENT AND TRADEMARK OFFICE
CERTIFICATE OF CORRECTION

PATENT NO. : 7,563,731 B2  Page 1 of 1
APPLICATION NO. : 11/739279
DATED : July 21, 2009
INVENTOR(S) : Christop Schwan et al.

It is certified that error appears in the above-identified patent and that said Letters Patent is hereby corrected as shown below:

Column 17, line 54 (claim 10, line 1), delete "claim 9" and insert therefor -- claim 17 --.

Signed and Sealed this

Twenty-fifth Day of August, 2009

David J. Kappos
*Director of the United States Patent and Trademark Office*